United States Patent
Dostalik

(10) Patent No.: US 7,067,435 B2
(45) Date of Patent: Jun. 27, 2006

(54) METHOD FOR ETCH-STOP LAYER ETCHING DURING DAMASCENE DIELECTRIC ETCHING WITH LOW POLYMERIZATION

(75) Inventor: William W. Dostalik, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/953,708

(22) Filed: Sep. 29, 2004

(65) Prior Publication Data
US 2006/0068592 A1 Mar. 30, 2006

(51) Int. Cl.
H01L 21/302 (2006.01)
H01L 21/461 (2006.01)

(52) U.S. Cl. ............. 438/740; 438/738; 257/E21.032; 257/E21.218; 257/E21.219

(58) Field of Classification Search ............ 438/706, 438/737, 738, 740
See application file for complete search history.

(56) References Cited

U.S. PATENT DOCUMENTS

| | | | |
|---|---|---|---|
| 6,337,277 B1 * | 1/2002 | Chou et al. ............... | 438/689 |
| 6,372,631 B1 * | 4/2002 | Wang et al. .............. | 438/624 |
| 6,605,540 B1 * | 8/2003 | Ali et al. ................. | 438/694 |
| 6,809,028 B1 * | 10/2004 | Chen et al. ............... | 438/637 |
| 6,828,251 B1 * | 12/2004 | Su et al. .................. | 438/724 |
| 2003/0008512 A1 * | 1/2003 | Ali et al. ................. | 438/694 |
| 2003/0020176 A1 * | 1/2003 | Nambu .................... | 257/774 |
| 2003/0024902 A1 * | 2/2003 | Li et al. .................. | 216/67 |
| 2003/0129825 A1 * | 7/2003 | Yoon ...................... | 438/626 |
| 2003/0181034 A1 * | 9/2003 | Jiang et al. ............... | 438/638 |
| 2004/0087133 A1 * | 5/2004 | Kumar ..................... | 438/618 |
| 2004/0192058 A1 * | 9/2004 | Chu et al. ................ | 438/710 |
| 2005/0104150 A1 * | 5/2005 | Wetzel et al. ............. | 257/437 |

* cited by examiner

Primary Examiner—Caridad Everhart
(74) Attorney, Agent, or Firm—Peter K. McLarty; W. James Brady, III; Frederick J. Telecky, Jr.

(57) ABSTRACT

The present invention provides a method for etching a substrate 100. The method includes conducting a first etch through a dielectric layer 130 located over an etch-stop layer 140, the dielectric layer having a photoresist layer 170 located thereover and the first etch being selective to the etch-stop layer 140. A second etch different from the first etch is conducted on the etch-stop layer 120, the second etch including nitrogen and at least one fluorocarbon gas, such that the ratio of nitrogen to carbon in the etchant is greater than about 5:1.

18 Claims, 2 Drawing Sheets

METHOD FOR ETCH-STOP LAYER ETCHING DURING DAMASCENE DIELECTRIC ETCHING WITH LOW POLYMERIZATION

TECHNICAL FIELD OF THE INVENTION

The present invention is directed, in general, to etching of a semiconductor substrate and, more specifically, to a method for etching of an etch-stop layer in a damascene trench or via opening using an etch process which produces little or no polymer.

BACKGROUND OF THE INVENTION

Integrated circuits are mass produced by fabricating hundreds of identical circuit patterns on a single semiconductor wafer. One of the many different processes repeated repeatedly in manufacturing these integrated circuits is that of using a mask and etchant for forming a particular feature. In such a mask and etching process, a photo mask containing the pattern of the structure to be fabricated is created, then, after formation of a material layer within which the feature is to be formed, the material layer is coated with a light-sensitive material called photoresist or resist. The resist-coated material layer is exposed to ultraviolet light through the mask, thereby transferring the pattern from the mask to the resist. The wafer is etched to remove the material layer unprotected by the resist, and then the remaining resist is stripped. This masking process permits specific areas of the material layer to be formed to meet the desired device design requirements.

In the etching process described above, it may be important that the etching selectively remove the unwanted material and that the material underlying the material layer is not significantly altered. A common way to accomplish this is to deposit or otherwise form an etch-stop layer on the wafer prior to formation of the material layer to be etched. Such etch-stop layers are commonly made of a material that is resistant to the particular etching process used for the overlying material layer. In such a case, the etch process is said to be "selective" to the etch-stop layer.

The connections between the transistors in a semiconductor device are referred in the art as interconnects. When copper is used as the interconnect conductor, the copper features may be defined using the damascene process. In this process, material is removed from the dielectric used in the interconnect level in the pattern of the desired copper features, after which these areas of removed dielectric are filled with copper. Removal of the dielectric material is typically done using an etch process utilizing a plasma.

The damascene process may use an etch-stop layer under the dielectric layer being patterned. When it is used, it is prior to filling the patterned features with copper to allow electrical connection between multiple levels of the integrated circuit. Removal of the etch-stop layer can be done by either an ex-situ or in-situ process.

An ex-situ etch-stop etch process is one in which the dielectric etch is done, and chamber vacuum is broken before the etch-stop etch is done. Moreover, the substrate may be removed from the chamber, and the etch-stop etch process may be performed as another process step, perhaps in another plasma reactor. There may optionally be processing steps separating the two etch processes, such as a cleaning process to remove photoresist and etch residue. An in-situ etch-stop etch process is one in which the etch-stop etch is performed in the same plasma tool as the dielectric etch, without breaking vacuum. The in-situ etch-stop etch allows processing steps to be eliminated, reducing manufacturing costs.

One disadvantageous result of using an in-situ etch process is that etch residues, referred to as "polymer," produced during the trench or via etch process, are not removed prior to the etch-stop etch. When the etch-stop layer overlies a metal level, the opening in the dielectric generally overlies copper structures in the lower interconnect level. When copper is exposed during the etch-stop etch process, copper can be sputtered onto the polymer on the walls of the opening. When copper is sputtered onto the polymer, the resulting residue can be difficult to remove in subsequent cleanup steps, and may result in increased particle defects on the semiconductor substrate. Furthermore, the presence of polymer in the bottom of the trench or via opening decreases the uniformity of the thickness of the combined etch-stop layer and polymer, requiring a longer over-etch at the end of the etch-stop etch process. The longer over-etch exacerbates the copper sputtering by leaving copper exposed to the plasma for a longer period on some areas of the wafer. The combination of these effects leads to lower product yield and higher manufacturing costs per finished unit.

In order to address the above cited deficiencies in the art, what is needed in the semiconductor art is an in-situ etch-stop etch process that results in lower polymer formation.

SUMMARY OF THE INVENTION

To address the deficiencies of the prior art that are discussed above, the present invention provides a method for etching a substrate and a method of forming an integrated circuit using the method of etching. In one embodiment, the method of etching a substrate includes conducting a first etch through a dielectric layer located over an etch-stop layer, the dielectric layer having a photoresist layer located over it, and the first etch being selective to the etch-stop. A second etch different from the first etch is conducted on the etch-stop with the second etch including nitrogen and at least one fluorocarbon gas, with a weighted average ratio of nitrogen to carbon in the etchant greater than about 5:1.

In another embodiment, there is a method of forming an integrated circuit. In this embodiment, the method includes forming transistors over a semiconductor substrate, forming a first dielectric layer over the transistor, depositing a hardmask on the dielectric layer, placing an anti-reflective layer on the hardmask, and then conducting a first etch through the dielectric layer located over an etch-stop layer. The dielectric layer has a photoresist layer located over it, and the first etch is selective to the etch-stop. The method further includes conducting a second etch different from the first etch on the etch-stop, with the second etch including nitrogen and at least one fluorocarbon gas, with a weighted average ratio of nitrogen to carbon in the etchant greater than about 5:1. The method continues with the formation of additional dielectric layers over the first dielectric layer, and forming interconnects with the first dielectric layer and the additional dielectric layers to interconnect the transistors and thereby form an operative integrated circuit.

In a third embodiment, a method is provided for etching a substrate which includes conducting a first etch through a dielectric layer located over an etch-stop layer, the dielectric layer having a photoresist layer located over it and the first etch being selective to the etch-stop. The method further includes conducting a second etch different from the first etch on the etch-stop, the second etch having an etch rate modulator which includes nitrogen associated with it and at least one fluorocarbon gas, with a weighted average ratio of nitrogen to carbon in the etchant greater than about 5:1.

The foregoing has outlined preferred and alternative features of the present invention so that those skilled in the art may better understand the detailed description of the invention that follows. Additional features of the invention will be described below that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
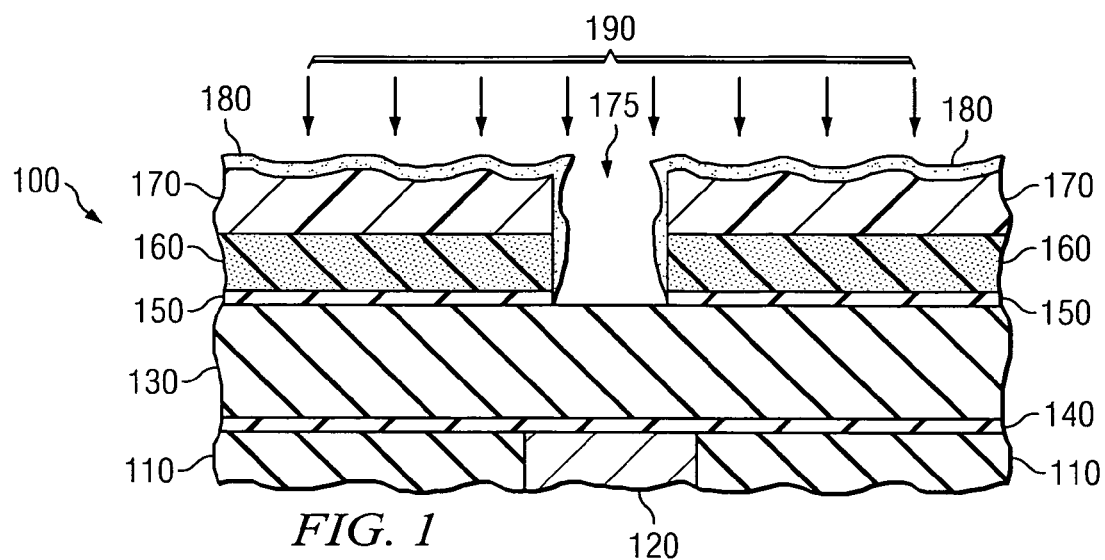
FIG. 1 illustrates a sectional view of a semiconductor substrate as it would appear at the beginning of etch processing according to the claimed invention.

Referring initially to FIG. 1, illustrated is a sectional view of a semiconductor substrate 100 processed up to the point of etching the substrate according to the claimed invention, as etch processing begins. Dielectric layer 110 is the inter-metal dielectric (IMD) for the interconnect level immediately preceding the interconnect level, which may be either a via level or metal level, to be processed according to the claimed invention. Conductor 120 is embedded in the IMD 110, and may include copper and diffusion barrier layers. Those skilled in the art will recognize that conductor 120 may be an interlevel via or an intralevel trace, depending on the details of the integrated fabrication process. FIG. 1 shows the general case for which one or more interconnect levels have completed processing, though the claimed method could also be applied to the first interconnect level. In that case, dielectric 110 would be the dielectric spacing the transistors from the first interconnect level, and conductor 120 would be a contact, possibly formed from tungsten, to an electrical component such as a transistor device.

Dielectric layer 130 is the IMD for the current interconnect level being fabricated and is separated from dielectric layer 110 and conductor 120 by etch-stop 140, which may be conventionally deposited silicon nitride, silicon carbide or other suitable material. Those skilled in the art will appreciate that semiconductor process technology is continually evolving, and that future etch-stop materials may include compounds such as silicon carbonitride, aluminum oxide and aluminum oxynitride. Etch-stop 140 serves to provide a stopping layer for an etch process making openings in dielectric 130, and may also serve as a diffusion barrier for copper in conductor 120, if copper is used. Dielectric layer 130 may be one or more layers of the same or different dielectric materials, depending on the specifics of the interconnect design. Layer 130 may comprise a conventional (silicon dioxide) dielectric and may additionally comprise one or more of the class of dielectrics known as "low-k" or "ultra low-k" dielectrics. Examples of some of these low-k or ultra low-k dielectrics include siloxane, silsesquioxane (SSQ)-based materials, e.g., MSQ (methylsilsesquioxane) or hydrogensilsesquioxane (HSQ), silica-based materials, e.g., carbon- or fluorine-doped silica glasses, organic-polymer-based materials, amorphous-carbon-based materials, and any other dielectric material that exhibits low or ultra low-k characteristics and may additionally be porous. This list of specific materials is exemplary and not intended to limit the scope of the present invention. For the purposes of this invention, low-k dielectrics have a dielectric permittivity less than about 3.9, which is the dielectric constant of plasma-deposited silicon dioxide, and ultra low-k materials have a dielectric constant less than about 2.6.

Overlying dielectric 130 in FIG. 1 is a conventionally deposited hardmask 150 used to aid in the photolithographic process, and may further act to protect the dielectric layer 130 during polishing processes subsequent to the etch of the current level. Those skilled in the semiconductor art will recognize that depending on the integrated fabrication process, it may be desirable to use a single hardmask layer. Alternatively, two or more hardmask layers may be needed. The choice of hardmask materials and thicknesses is dictated by the specific requirements of the integrated fabrication process, and by performance requirements for the finished integrated circuit.

A conventional anti-reflective coating (ARC) 160 can be used to optically match the substrate to the exposure source used in the photolithography process. Photoresist 170 is deposited onto ARC 160, and is patterned and developed by conventional means. The opening 175 in photoresist 170 defines the pattern to be etched into ARC 160, hardmask layers 150, and ultimately into dielectric 130 and etch-stop 140.

In FIG. 1, the ARC 160 and hardmask 150 in opening 175 have been removed by a conventional etch process suited to the specific implementation of these layers. In general, however, the etch process used to etch ARC 160 and hardmask 150 forms a "polymer" 180, which covers at least a portion of the photoresist 170 and the sidewalls of opening 175 in FIG. 1. Polymer refers to the solid residue deposited onto the surface of the etched substrate under certain plasma conditions. The polymer 180 is, among other things, relied on to passivate the sidewalls of opening 175 to produce an anisotropic etch, but must be removed prior to filling the opening 175 with metal.

Figure 2:
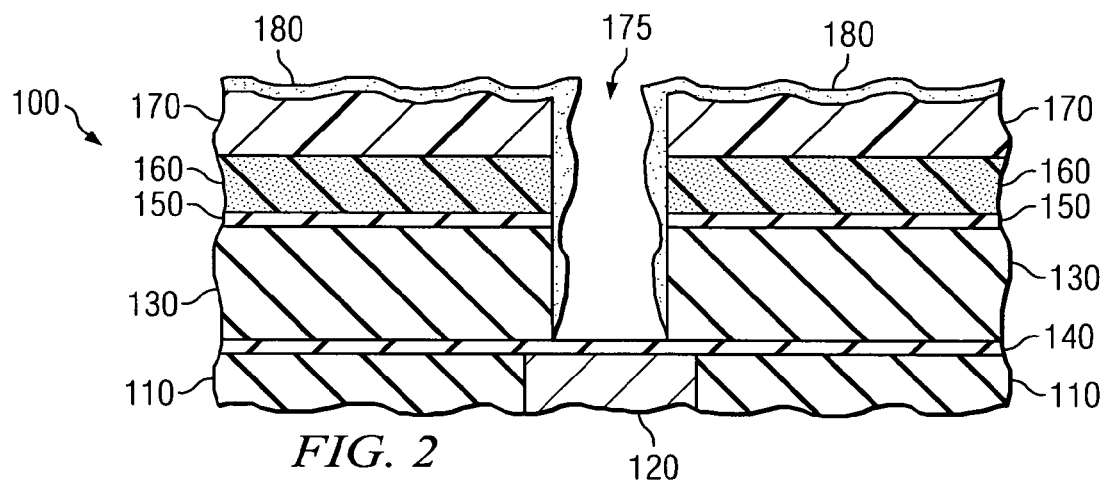
FIG. 2 illustrates a sectional view of a semiconductor substrate after completion of the first step of the etch process according to the claimed invention.

FIG. 2 shows a sectional view of substrate 100 after a first etch according to the presently claimed invention. The first etch has transferred the pattern from the photoresist/ARC/hardmask stack to dielectric 130. The process used in the first etch is conventional, but specific to the dielectric stack used in dielectric 130. This process is further designed to be selective to etch-stop 140, leaving at least a portion of etch-stop 140 unetched after completion of the dielectric etch.

Figure 3:
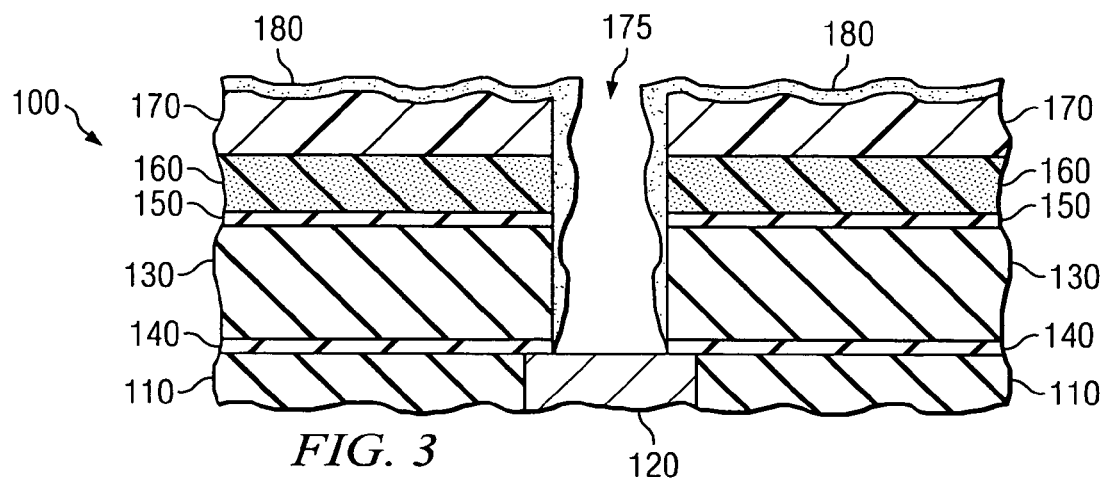
FIG. 3 illustrates a sectional view of a semiconductor substrate after completion of the second step of the etch process according to the claimed invention.

FIG. 3 shows a sectional view of substrate 100 after a second etch according to the presently claimed invention.

Hardmask 140 has been removed at the bottom of opening 175 to expose conductor 120. Polymer 180 in FIG. 3 is shown diminished in thickness over the photoresist 170, and on the sidewalls of opening 175, as a result of the consumption of polymer during the second etch.

In an advantageous embodiment of the invention, gases used in the second etch of the invention include an etching gas and an "etch rate modulator," as described below. The etching gas serves the primary purpose of providing chemically reducing species to the plasma to assist in the volatilization and removal of material on the surface of the substrate. One skilled in the art will recognize that one or more gases which provide oxidizing species to the plasma may be used, as well as an inert carrier gas. As used in this context, an oxidizing species refers to a chemical species which can accept electrons in a chemical reaction related to the etching of the substrate. It is well known to those skilled in the plasma etch arts that different oxidizing species may have different reactivities in the etch. For example, both nitrogen and oxygen can be used as an oxidizing species in the plasma, but nitrogen has a reactivity of about one-tenth that of oxygen.

The relative concentrations of the oxidizing and inert gases can be varied to increase the etch rate (by use of the more reactive gases) or reducing it (by dilution with less reactive or inert gases). The combination of these gases is referred to herein as an etch rate modulator, the properties of which are determined by the gases used and their relative concentrations in the plasma.

Those skilled in the art will recognize that the first and second etches may be carried out in any of several suitable plasma reactors. Regardless of the particular reactor used, several parameters control the properties of a plasma etch process, including plasma power, chamber pressure, constituent gases, the flow rate of these gases, and substrate temperature.

In an advantageous embodiment, the etching gas used in the second etch is tetrafluoromethane at a flow rate of about 30 sccm. In addition, an etch rate modulator is used, which comprises argon flowing at about 700 sccm, oxygen flowing at about 10 sccm, and nitrogen flowing at about 200 sccm. The pressure of the chamber in this embodiment is regulated to maintain about 100 mTorr, and the plasma power is about 300 Watts. The substrate temperature is regulated to maintain about 40° C.

Though the embodiment cited above produces a uniquely advantageous reduction of particles and residue, the plasma parameters may vary from those of the embodiment discussed above and still achieve satisfactory results. The flow rate of tetrafluoromethane may vary from about 10 sccm to about 60 sccm. The flow rate of argon may range from about zero sccm to about 1000 sccm, that of oxygen may vary from about 5 sccm to about 50 sccm, and that of nitrogen may vary from about 50 sccm to about 500 sccm. The power may range from about 150 Watts to about 1000 Watts, and the chamber pressure may vary from about 20 mTorr to about 200 mTorr. Within these ranges, the plasma parameters will result in a beneficially low production of polymer and enable a reduced over-etch to result in lower residue and particle count.

In another embodiment of the invention, the ratio of nitrogen to carbon in the plasma is regulated to control the etch characteristics of the second etch. Nitrogen is provided to the plasma simply by flowing nitrogen gas. However, one or more fluorocarbon gases may be used as a source of carbon. Because the amount of carbon depends on the empirical formula of the particular fluorocarbon gases used, a weighted average of carbon in the fluorocarbon gases is used to describe the ratio of nitrogen to carbon. Examples of the computation of the nitrogen:carbon ratio follow, but it is recognized that the values cited in these examples are illustrative only, and are not intended to limit the scope of the invention in any way. In a first example, 10 sccm of nitrogen ($N_2$) and 10 sccm of tetrafluoromethane ($CF_4$) are allowed to flow into the chamber, in which case the nitrogen:carbon ratio would be computed as:

$$\frac{10 \, sccm \, N_2}{20 \, sccm \, \text{total flow}} \times 2 \, N \text{ per } N_2 = 1 \text{ Part } N$$

$$\frac{10 \, sccm \, CF_4}{20 \, sccm \, \text{total flow}} \times 1 \, C \text{ per } CF_4 = 0.5 \text{ Parts } C$$

for a nitrogen:carbon ratio of 2:1. In a second example, 10 sccm of nitrogen, 10 sccm of tetrafluoromethane and 20 sccm of hexafluoroethane ($C_2F_6$) are allowed to flow, resulting in a nitrogen:carbon ratio of 2:5, since the weighted average flow of nitrogen is now:

$$\frac{10 \, sccm \, N_2}{40 \, sccm \, \text{total flow}} \times 2 \, N \text{ per } N_2 = 0.5 \text{ Parts } N$$

and the weighted average flow of carbon from the fluorocarbon gases is:

$$\frac{10 \, sccm \, CF_4}{40 \, sccm \, \text{total flow}} \times 1 \, C \text{ per } CF_4 +=$$

$$\frac{20 \, sccm \, C_2F_6}{40 \, sccm \, \text{total flow}} \times 2 \, C \text{ per } C_2F_6 = 1.25 \text{ Parts } C.$$

In an advantageous embodiment of the invention, the nitrogen:carbon ratio is greater than about 5:1, with greater than about 10:1 being preferred.

In yet another embodiment of the invention, the ratios of the flows of the gaseous constituents of the plasma are regulated to produce the beneficial characteristics of the second etch. In an advantageous embodiment, the ratio of the tetrafluoromethane to oxygen is about 3:1, the ratio of the tetrafluoromethane to argon is about 3:70, and the ratio of tetrafluoromethane to nitrogen is about 3:20. While these flow rate ratios are maintained, the pressure of the plasma is regulated to be about 100 mTorr.

The second etch may be conducted either in-situ or ex-situ. The use of an in-situ process is particularly beneficial, however, in that a single manufacturing step may be used to conduct both the first and second etches. In the in-situ embodiment, the wafer may remain in the etch reactor after the first etch of dielectric 130 without breaking vacuum to be subjected to a second etch process to remove the etch-stop. Those skilled in the art will appreciate that variants of the in-situ process are possible, such as transfer from one etch chamber after the first etch to a different etch chamber for the second etch, or plasma-assisted removal of photoresist 170 and ARC 160, without breaking vacuum prior to completion of the second etch. In an ex-situ embodiment, vacuum may be broken after the first etch, and additional processing steps may be performed prior to the second etch. Such processing, if performed, may also include removal of the photoresist 170 and ARC 160, possibly using a plasma process.

The second etch of the invention achieves a unique benefit by reducing the amount of sidewall polymer. In the cited embodiments, the etch process is relatively "clean," i.e., producing little or no polymer while maintaining sufficient selectivity to dielectric 110. By reducing sidewall polymer, the amount of polymer to be removed in cleanup is reduced, and there is less polymer to react with sputtered copper to produce insoluble organometallic compounds. Furthermore, by reducing the polymer on the bottom of the opening 175, less over-etch is required, and the amount of copper sputtered is reduced. The combination of these effects leads to a uniquely beneficial effect in reduction of burden on the post-etch clean, and in reducing the yield limiting particles.

Figure 4:
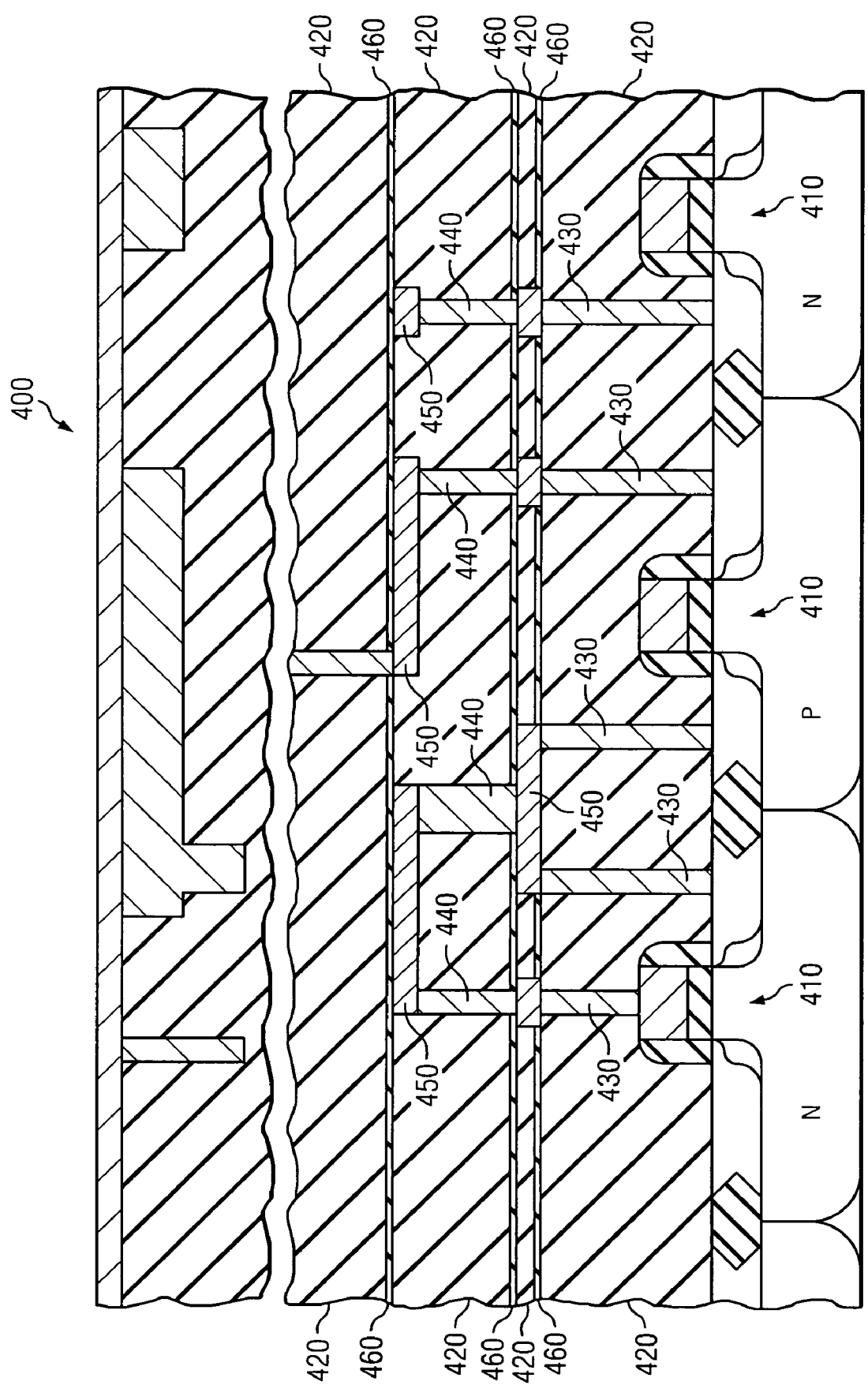
FIG. 4 illustrates a sectional view of a semiconductor device manufactured according to the principles of the claimed invention.

Referring finally to FIG. 4, illustrated is a cross-sectional view of an integrated circuit (IC) 400 incorporating semiconductor devices 410, interconnected with contacts 430, vias 440, and metal traces 450. The vias 440 and metal traces 450 are embedded in conventionally deposited dielectric 420, which may be single or multilayered, using one or more dielectric materials, one or more of which may be low-k dielectrics. Etch-stop layer 460 overlies dielectric 420 and metal traces 450, and may comprise conventionally deposited silicon nitride, silicon carbide, or other suitable dielectric material. At least one level of dielectric 420 has been processed according to the principles of the current invention to produce metal openings in which metal is placed for vias and/or metal traces. The IC 400 may include devices, such as transistors used to form CMOS devices, BiCMOS devices, bipolar devices, capacitors or other types of devices. The IC 400 may further include passive devices, such as inductors or resistors, or it may also include optical devices or optoelectronic devices. Those skilled in the art are familiar with these various types of devices and their manufacture. Metal traces 450 and vias 430 are used to connect the various devices to form the operational IC 400.

The interconnect architecture of the IC 400 is exemplary of one that may be fabricated according to the principles of the invention. It will be apparent to one skilled in the art that several variations of the exemplary interconnect architecture may be fabricated according to the principles of the invention with similarly advantageous results.

Although the present invention has been described in detail, those skilled in the art should understand that they can make various changes, substitutions and alterations herein without departing from the spirit and scope of the invention in its broadest form.

What is claimed is:

1. A method for etching an etch-stop located over a substrate, comprising:
    conducting a first etch through a dielectric layer located over an etch-stop layer, the dielectric layer having a photoresist layer located thereover and the first etch being selective to the etch-stop; and
    conducting a second etch different from the first etch on the etch-stop, the second etch comprising a mixture of gases wherein an etching gas comprises tetrafluoromethane and an etch rate modulator includes a mixture of argon, oxygen and nitrogen and wherein the ratio of a flow rate of tetrafluoromethane to a flow rate of the oxygen is about 3:1, the ratio of the flow rate of tetrafluoromethane to a flow rate of argon is about 3:70, the ratio of the flow rate of tetrafluoromethane to a flow rate of nitrogen is about 3:20, and the weighted average ratio of nitrogen to carbon is greater than about 10:1.

2. The method as recited in claim 1 wherein the etch-stop layer is selected from the group consisting of silicon nitride, silicon carbide, silicon carbonitride, aluminum oxide, and aluminum oxynitride.

3. The method as recited in claim 1 wherein the second etch is conducted in the same etch reactor as the first etch without breaking vacuum between the first and second etch.

4. The method as recited in claim 1 wherein the tetrafluoromethane has a flow rate that ranges from about 10 sccm to about 60 sccm and a flow rate of the argon ranges from about zero sccm to about 1000 sccm, a flow rate of the nitrogen ranges from about 50 sccm to about 500 sccm, and a flow rate of the oxygen ranges from about 5 sccm to about 50 sccm.

5. The method as recited in claim 4 wherein the flow rate of the tetrafluoromethane is about 30 sccm, the flow rate of the oxygen is about 10 sccm, the flow rate of the nitrogen is about 200 sccm, and the flow rate of the argon is about 700 sccm.

6. The method as recited in claim 1 wherein a power of the second etch ranges from about 150 Watts to about 1000 Watts and a pressure of the second etch ranges from about 20 mTorr to about 200 mTorr and the temperature of the substrate is about 40° C.

7. The method as recited in claim 6 wherein the power is 300 Watts and the pressure is 100 mTorr.

8. The method as recited in claim 1 wherein the substrate is a dielectric material and wherein at least a portion of the dielectric layer has a dielectric constant less than about 3.9.

9. The method as recited in claim 8 wherein the portion of the dielectric layer is a carbon doped glass.

10. A method for manufacturing an integrated circuit, comprising:
    forming transistors over a semiconductor substrate;
    forming a first dielectric layer over the transistor;
    depositing a hardmask on the dielectric layer;
    placing an anti-reflective layer on the hardmask;
    conducting a first etch through a second dielectric layer located over an etch-stop layer, the second dielectric layer having a photoresist layer located thereover and the first etch being selective to the etch-stop;
    conducting a second etch different from the first etch on the etch-stop, the second etch comprising a mixture of gases wherein an etching gas comprises tetrafluoromethane and an etch rate modulator includes a mixture of argon, oxygen and nitrogen and wherein the ratio of a flow rate of tetrafluoromethane to a flaw rate of the oxygen is about 3:1, the ratio of the flow rate of tetrafluoromethane to a flow rate of argon is about 3:70, the ratio of the flow rate of tetrafluoromethane to a flow rate of nitrogen is about 3:20, and the weighted average ratio of nitrogen to carbon is greater than about 10:1;
    forming additional dielectric layers over the first dielectric layer; and
    forming interconnects with the first dielectric layer and the additional dielectric layers to interconnect the transistors and thereby form an operative integrated circuit.

11. The method as recited in claim 10 wherein the etch-stop layer is selected from the group consisting of silicon nitride, silicon carbide, silicon carbonitride, aluminum oxide, and aluminum oxynitride.

12. The method as recited in claim 10 wherein the second etch is conducted in the same etch reactor as the first etch without breaking vacuum between the first and second etch.

13. The method as recited in claim 10 wherein the tetrafluoromethane has a flow rate that ranges from about 10 sccm to about 60 sccm and a flow rate of the argon ranges from about zero sccm to about 1000 sccm, a flow rate of the nitrogen ranges from about 50 sccm to about 500 sccm, and a flow rate of the oxygen ranges from about 5 sccm to about 50 sccm.

14. The method as recited in claim 13 wherein the flow rate of the tetrafluoromethane is about 30 sccm, the flow rate of the oxygen is about 10 sccm, the flow rate of the nitrogen is about 200 sccm, and the flow rate of the argon is about 700 sccm.

15. The method as recited in claim 10 wherein a power of the second etch ranges from about 150 Watts to about 1000 Watts and a pressure of the second etch ranges from about 20 mTorr to about 200 mTorr and the temperature of the substrate is about 40° C.

16. The method as recited in claim 15 wherein the power is about 300 Watts and the pressure is about 100 mTorr.

17. The method as recited in claim 10 wherein at least a portion of the second dielectric layer has a dielectric constant less than about 3.9.

18. The method as recited in claim 17 wherein the portion of the second dielectric layer is a carbon doped glass.

* * * * *